(12) United States Patent
Biwa

(10) Patent No.: US 7,948,454 B2
(45) Date of Patent: May 24, 2011

(54) METHOD FOR DRIVING LIGHT-EMITTING DIODE, LIGHT-EMITTING DIODE, METHOD FOR DRIVING DISPLAY, DISPLAY, METHOD FOR DRIVING ELECTRONIC DEVICE, ELECTRONIC DEVICE, METHOD FOR DRIVING OPTICAL COMMUNICATION APPARATUS, AND OPTICAL COMMUNICATION APPARATUS

(75) Inventor: Goshi Biwa, Kanagawa (JP)

(73) Assignee: Sony Corporation, Tokyo (JP)

( * ) Notice: Subject to any disclaimer, the term of this patent is extended or adjusted under 35 U.S.C. 154(b) by 957 days.

(21) Appl. No.: 11/891,216

(22) Filed: Aug. 9, 2007

(65) Prior Publication Data

US 2008/0054822 A1 Mar. 6, 2008

(30) Foreign Application Priority Data

Aug. 11, 2006 (JP) ................................ 2006-219583

(51) Int. Cl.
*G09G 3/30* (2006.01)
*G09G 3/32* (2006.01)
*H01L 29/06* (2006.01)

(52) U.S. Cl. ................... 345/80; 345/82; 257/13

(58) Field of Classification Search .................... 345/80, 345/82, 83, 84; 257/11, 13, 59, 113
See application file for complete search history.

(56) References Cited

U.S. PATENT DOCUMENTS

| 6,635,904 B2 | 10/2003 | Goetz et al. | |
|---|---|---|---|
| 2005/0280375 A1* | 12/2005 | Chikugawa et al. | 315/291 |
| 2006/0157717 A1* | 7/2006 | Nagai et al. | 257/81 |

FOREIGN PATENT DOCUMENTS

| JP | 2002-237619 | | 8/2002 |
|---|---|---|---|
| JP | 2003-022052 | | 1/2003 |
| JP | 2005-072368 | A | 3/2005 |
| JP | 2005-206424 | A | 8/2005 |
| JP | 2005-260116 | | 9/2005 |
| JP | 2005-276976 | A | 10/2005 |
| JP | 2006-190803 | A | 7/2006 |

* cited by examiner

*Primary Examiner* — Kevin M Nguyen
(74) *Attorney, Agent, or Firm* — Wolf, Greenfield & Sacks, P.C.

(57) ABSTRACT

A method for driving a light-emitting diode includes the step of modulating the luminance of the light-emitting diode with current density within the range of 20 A/cm$^2$ or less. The light-emitting diode includes a p-type layer, an n-type layer, and a light-emitting layer disposed therebetween and having an indium-containing quantum well structure. Each of the p-type layer, the n-type layer, and the light-emitting layer includes a nitride-based group III-V compound semiconductor crystal having a wurtzite structure. The light-emitting layer has a main surface inclined at an angle of 0.25° to 2° with respect to a c-plane.

17 Claims, 14 Drawing Sheets

METHOD FOR DRIVING LIGHT-EMITTING DIODE, LIGHT-EMITTING DIODE, METHOD FOR DRIVING DISPLAY, DISPLAY, METHOD FOR DRIVING ELECTRONIC DEVICE, ELECTRONIC DEVICE, METHOD FOR DRIVING OPTICAL COMMUNICATION APPARATUS, AND OPTICAL COMMUNICATION APPARATUS

CROSS REFERENCES TO RELATED APPLICATIONS

The present invention contains subject matter related to Japanese Patent Application JP 2006-219583 filed in the Japanese Patent Office on Aug. 11, 2006, the entire contents of which are incorporated herein by reference.

BACKGROUND OF THE INVENTION

1. Field of the Invention

The present invention relates to methods for driving light-emitting diodes, light-emitting diodes, methods for driving displays, displays, methods for driving electronic devices, electronic devices, methods for driving optical communication apparatuses, and optical communication apparatuses. In particular, the present invention relates to methods for driving light-emitting diodes suitable for applications such as a variety of displays including InGaN/GaN-based light-emitting diodes.

2. Description of the Related Art

InGaN/GaN-based light-emitting diodes, particularly ones with emission wavelengths in the visible region, can vary in emission wavelength (color) with drive current density. Japanese Unexamined Patent Application Publication No. 2002-237619, for example, proposes a method for driving light-emitting diodes using this phenomenon to achieve polychromatic light emission.

When used for typical color displays, however, such light-emitting diodes cause the problem that a desired color range where the color varies with drive current density is difficult to provide. It may also be possible to convert chromaticity according to colors and color ranges varying with current density. This method, however, results in a narrower color range than normal because only a common portion of varying color ranges is used for accurate color reproduction. In addition, the need for enormous quantities of calculation, depending on the number of pixels and frame rate, puts a high load on signal processing circuits and drive circuits.

To avoid this phenomenon when light-emitting diodes are used for displays, for example, Japanese Unexamined Patent Application Publication No. 2003-22052 discloses a technique for generating luminance signals by pulse driving (such as pulse density modulation (PDM) or pulse width modulation (PWM)) while maintaining constant current density to prevent color variations. Also, Japanese Unexamined Patent Application Publication No. 2005-260116 discloses a technique for modulating luminance only by pulse driving while controlling current density so as to provide a desired emission wavelength using the phenomenon that the color varies with current density. These techniques are effective when light-emitting diodes, which can have color variations after manufacture, are applied to high-quality displays. However, the need for adjustment of emission wavelength and luminance contributes to increased inspection/adjustment costs. In addition, these techniques put a high load on signal processing circuits and drive circuits. Furthermore, extending the dynamic range of luminance requires the use of a high-frequency circuit to increase pulse frequency.

U.S. Pat. No. 6,635,904, for example, proposes the production of InGaN/GaN-based light-emitting diodes using a vicinal substrate as a growth substrate, for example, a sapphire substrate having a main surface inclined at an angle of 0.2° to 2° with respect to the c-plane. According to this publication, the light-emitting diodes have improved luminous efficiency and homology. This publication, however, has no disclosure or suggestion as to the current density dependence of the emission wavelength of the light-emitting diodes or no description of advantages for application to displays.

SUMMARY OF THE INVENTION

The phenomenon of variations in the emission wavelength of InGaN/GaN-based light-emitting diodes with drive current density is common to light-emitting diodes including light-emitting layers having an indium-containing quantum well structure. This phenomenon results from localized carriers of indium atoms and a piezoelectric field due to lattice mismatch in a wurtzite crystal structure. In particular, the phenomenon appears remarkably in emission of green light. In general, the phenomenon is serious for light-emitting diodes with emission wavelengths of 500 to 550 nm, particularly, 515 to 535 nm when they are used in displays featuring a wide color range.

Accordingly, it is desirable to provide a method for driving a light-emitting diode and a light-emitting diode with significantly reduced variations in emission wavelength with drive current density and also provide a method for driving a display and a display using such a method for driving a light-emitting diode.

In addition, it is desirable to provide a method for driving an electronic device, an electronic device, a method for driving an optical communication apparatus, and an optical communication apparatus using the method for driving a light-emitting diode.

As a result of intensive studies, the inventor has found that light-emitting diodes including light-emitting layers having an indium-containing quantum well structure, for example, InGaN/GaN-based light-emitting diodes, particularly, green light-emitting diodes, do not substantially vary in emission wavelength with current density within a particular current density range, namely, 20 A/cm$^2$ or less, if the diodes are formed using a vicinal substrate with a particular inclination angle as a growth substrate, namely, a substrate having a main surface inclined at an angle of 0.25° to 2°, particularly 0.3° to 1°, with respect to the c-plane (inclined in an m-axis direction with the a-axis being the axis of rotation). This characteristic can be utilized to stabilize the emission wavelength (color) of, for example, displays, electronic devices, and optical communication apparatuses including the light-emitting diodes. In particular, a display including such light-emitting diodes can form part of luminance signals by current amplitude modulation because no color variations occur in the above current density range as the current density varies. The display can therefore provide an extended dynamic range, a reduced drive frequency, and a stable, wide color reproduction range.

A method, according to an embodiment of the present invention, for driving a light-emitting diode includes the step of modulating the luminance of the light-emitting diode with current density within the range of 20 A/cm$^2$ or less. The light-emitting diode includes a p-type layer, an n-type layer, and a light-emitting layer disposed therebetween and having an indium-containing quantum well structure. Each of the p-type layer, the n-type layer, and the light-emitting layer includes a nitride-based group III-V compound semiconductor crystal having a wurtzite structure. The light-emitting layer has a main surface inclined at an angle of 0.25° to 2° with respect to a c-plane.

The main surface of the light-emitting layer is preferably inclined at an angle of 0.3° to 1° with respect to the c-plane to reduce variations in emission wavelength with current density. From the same viewpoint, additionally, the luminance of the light-emitting diode is preferably modulated with current density within the range of 10 A/cm$^2$ or less, more preferably 5 A/cm$^2$ or less, still more preferably 2 A/cm$^2$ or less.

If necessary, pulse driving (such as PDM or PWM) may be used in combination with luminance modulation with current density.

Although the emission wavelength of the light-emitting diode is selected according to need, this embodiment is particularly effective for the green wavelength region, that is, an emission wavelength of 500 to 550 nm, for example, 515 to 535 nm.

The nitride-based group III-V compound semiconductor crystal having a wurtzite structure is most generally $Al_xB_yGa_{1-x-y-z}In_zAs_uN_{1-u-v}P_v$ (where $0 \leq x \leq 1$, $0 \leq y \leq 1$, $0 \leq z \leq 1$, $0 \leq u \leq 1$, $0 \leq v \leq 1$, $0 \leq x+y+z<1$, and $0 \leq u+v<1$), more specifically $Al_xB_yGa_{1-x-y-z}In_zN$ (where $0 \leq x \leq 1$, $0 \leq y \leq 1$, $0 \leq z \leq 1$, and $0 \leq x+y+z \leq 1$), typically $Al_xGa_{1-x-z}In_zN$ (where $0 \leq x \leq 1$ and $0 \leq z \leq 1$), examples thereof including GaN, InN, AlN, AlGaN, InGaN, and AlGaInN.

The indium-containing quantum well structure of the light-emitting layer (active layer) can be either a single quantum well structure or a multiple quantum well structure. The compositions of quantum well layers and barrier layers are selected according to, for example, emission wavelength.

A vicinal substrate may be used as a growth substrate to grow the light-emitting layer having the main surface inclined at an angle of 0.25° to 2° with respect to the c-plane. The vicinal substrate used may be, for example, a sapphire substrate, a SiC substrate, a nitride-based group III-V compound semiconductor substrate (such as a GaN substrate, an InAlGaN substrate, or an AlN substrate), or a ZnO substrate having a main surface inclined at an angle of 0.25° to 2° with respect to the c-plane. The above light-emitting diode structure can be formed by growing the light-emitting layer, the p-type layer, and the n-type layer on the vicinal substrate. These layers can be grown by a variety of epitaxial growth methods, including metal organic chemical vapor deposition (MOCVD), hydride vapor-phase epitaxy or halide vapor-phase epitaxy (HVPE), and molecular beam epitaxy (MBE).

A light-emitting diode according to another embodiment of the present invention includes a p-type layer, an n-type layer, and a light-emitting layer disposed therebetween and having an indium-containing quantum well structure. Each of the p-type layer, the n-type layer, and the light-emitting layer includes a nitride-based group III-V compound semiconductor crystal having a wurtzite structure. The light-emitting layer has a main surface inclined at an angle of 0.3° to 1° with respect to a c-plane.

Because the main surface of the light-emitting layer is inclined at an angle of 0.3° to 1° with respect to the c-plane, variations in emission wavelength with current density can be significantly reduced.

For other features, the above description of the method for driving the light-emitting diode applies to this embodiment.

A method, according to another embodiment of the present invention, for driving a display including at least one light-emitting diode includes the step of modulating the luminance of the light-emitting diode with current density within the range of 20 A/cm$^2$ or less. The light-emitting diode includes a p-type layer, an n-type layer, and a light-emitting layer disposed therebetween and having an indium-containing quantum well structure. Each of the p-type layer, the n-type layer, and the light-emitting layer includes a nitride-based group III-V compound semiconductor crystal having a wurtzite structure. The light-emitting layer has a main surface inclined at an angle of 0.25° to 2° with respect to a c-plane.

The luminance of the light-emitting diode may be modulated by forming part of screen luminance signals of the display with current density within the range of 20 A/cm$^2$ or less in combination with pulse driving (such as PWM). Various displays can be used as the display, including a light-emitting diode display including a matrix of pixels each of which includes the light-emitting diode (active-matrix or passive-matrix display); a transmissive or semitransmissive liquid crystal display including a backlight including the at least one light-emitting diode (light-emitting diode backlight) and a liquid crystal panel; a projection display including a light source including the at least one light-emitting diode (light-emitting diode light source) and a light valve. The light valve used can be, for example, a transmissive or reflective liquid crystal panel or a microelectromechanical system (MEMS) such as a digital micromirror device (DMD).

The above light-emitting diode display or light-emitting diode backlight includes, for example, red, green, and blue light-emitting diodes, each constituting one unit (pixel). For example, the red light-emitting diodes used can be formed of, but not limited to, an AlGaInP-based semiconductor, and the green and blue light-emitting diodes used can be formed of, but not limited to, a nitride-based group III-V compound semiconductor.

For other features, the above description of the method for driving the light-emitting diode applies to this embodiment.

A display according to another embodiment of the present invention includes at least one light-emitting diode including a p-type layer, an n-type layer, and a light-emitting layer disposed therebetween and having an indium-containing quantum well structure. Each of the p-type layer, the n-type layer, and the light-emitting layer includes a nitride-based group III-V compound semiconductor crystal having a wurtzite structure. The light-emitting layer has a main surface inclined at an angle of 0.3° to 1° with respect to a c-plane.

For other features, the above description of the method for driving the light-emitting diode, the light-emitting diode, and the method for driving the display applies to this embodiment.

A method, according to another embodiment of the present invention, for driving an electronic device including at least one light-emitting diode includes the step of modulating the luminance of the light-emitting diode with current density within the range of 20 A/cm$^2$ or less. The light-emitting diode includes a p-type layer, an n-type layer, and a light-emitting layer disposed therebetween and having an indium-containing quantum well structure. Each of the p-type layer, the n-type layer, and the light-emitting layer includes a nitride-based group III-V compound semiconductor crystal having a wurtzite structure. The light-emitting layer has a main surface inclined at an angle of 0.25° to 2° with respect to a c-plane.

The electronic device can basically be any device, portable or stationary, including at least one light-emitting diode for applications such as backlighting of liquid crystal displays, displaying, and illumination. Examples of such an electronic device include displays of the types described above, cellular phones, mobile devices, robots, personal computers, in-vehicle devices, and various household electrical appliances.

For other features, the above description of the method for driving the light-emitting diode and the method for driving the display applies to this embodiment.

An electronic device according to another embodiment of the present invention includes at least one light-emitting diode including a p-type layer, an n-type layer, and a light-emitting layer disposed therebetween and having an indium-containing quantum well structure. Each of the p-type layer, the n-type layer, and the light-emitting layer includes a nitride-based group III-V compound semiconductor crystal having a wurtzite structure. The light-emitting layer has a main surface inclined at an angle of 0.3° to 1° with respect to a c-plane.

For other features, the above description of the method for driving the light-emitting diode, the light-emitting diode, the method for driving the display, and the method for driving the electronic device applies to this embodiment.

A method, according to another embodiment of the present invention, for driving an optical communication apparatus including at least one light-emitting diode includes the step of modulating the luminance of the light-emitting diode with current density within the range of 20 A/cm$^2$ or less. The light-emitting diode includes a p-type layer, an n-type layer, and a light-emitting layer disposed therebetween and having an indium-containing quantum well structure. Each of the p-type layer, the n-type layer, and the light-emitting layer includes a nitride-based group III-V compound semiconductor crystal having a wurtzite structure. The light-emitting layer has a main surface inclined at an angle of 0.25° to 2° with respect to a c-plane.

The luminance of the light-emitting diode of the optical communication apparatus can be modulated with current density within the range of 20 A/cm$^2$ or less to generate optical signals which can then be transmitted through, for example, optical fiber, such as plastic fiber, for optical communication. This allows for highly reliable optical communication or transmission with stale emission wavelength.

For other features, the above description of the method for driving the light-emitting diode applies to this embodiment.

An optical communication apparatus according to another embodiment of the present invention includes at least one light-emitting diode including a p-type layer, an n-type layer, and a light-emitting layer disposed therebetween and having an indium-containing quantum well structure. Each of the p-type layer, the n-type layer, and the light-emitting layer includes a nitride-based group III-V compound semiconductor crystal having a wurtzite structure. The light-emitting layer has a main surface inclined at an angle of 0.3° to 1° with respect to a c-plane.

For other features, the above description of the method for driving the light-emitting diode and the method for driving the optical communication apparatus applies to this embodiment.

In the method for driving the light-emitting diode, the method for driving the display, the method for driving the electronic device, and the method for driving the optical communication apparatus according to the above embodiments of the present invention, the main surface of the light-emitting layer is inclined at an angle of 0.25° to 2° with respect to the c-plane. Accordingly, variations in emission wavelength with current density can be significantly reduced by modulating the luminance of the light-emitting diode with current density within the range of 20 A/cm$^2$ or less.

In the light-emitting diode, the display, the electronic device, and the optical communication apparatus according to the above embodiments of the present invention, the main surface of the light-emitting layer is inclined at an angle of 0.3° to 1° with respect to the c-plane. Accordingly, variations in emission wavelength with current density can be significantly reduced by modulating the luminance of the light-emitting diode with current density within the range of, for example, 20 A/cm$^2$ or less.

According to the above embodiments of the present invention, a light-emitting diode can be driven with stable emission wavelength irrespective of drive current density. A display including the light-emitting diode can therefore achieve a wide dynamic range, stable color reproduction, and a wide color reproduction range. In particular, a method for driving the light-emitting diode can be used in combination with PWM to achieve a wider dynamic range than achieved only by PWM, a reduction in PWM frequency, and simplified signal processing in, for example, luminance correction. This allows for a reduction in the load on a signal-processing circuit and a drive circuit. Thus, the embodiments of the present invention can provide advantages from many viewpoints, including gradation, color reproduction range, cost, and signal processing. In addition, an optical communication apparatus including the light-emitting diode can achieve stable emission wavelength to enable highly reliable optical communication or transmission.

DESCRIPTION OF THE PREFERRED EMBODIMENTS

Embodiments of the present invention will now be described with reference to the drawings.

A first embodiment of the present invention will be described.

Figure 1:
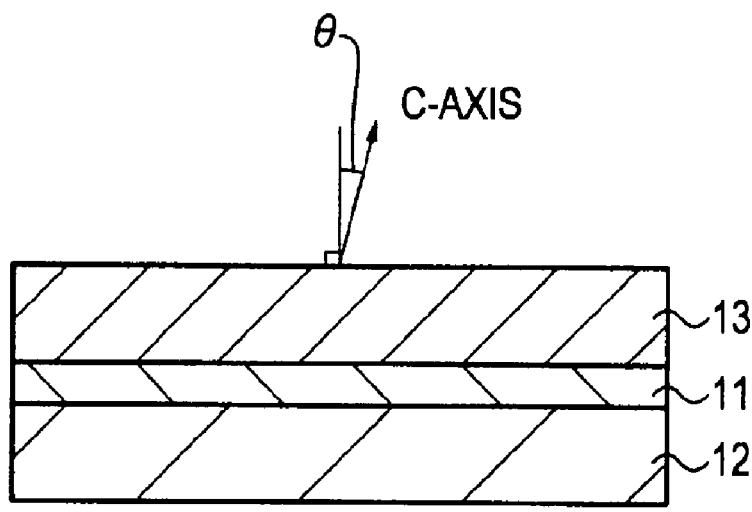
FIG. 1 is a sectional view of a GaN-based light-emitting diode according to a first embodiment of the present invention.

FIG. 1 illustrates a GaN-based light-emitting diode according to the first embodiment.

In FIG. 1, the GaN-based light-emitting diode includes an n-type layer 12, a p-type layer 13, and a light-emitting layer 11 disposed therebetween. The light-emitting layer 11 has an indium-containing quantum well structure. Each of the n-type layer 12, the p-type layer 13, and the light-emitting layer 11 includes a GaN-based compound semiconductor crystal having a wurtzite structure and has a main surface inclined at an angle θ of 0.25° to 2°, preferably, for example, 0.3° to 1°, with respect to the c-plane. Although not shown, an n-type electrode and a p-type electrode are disposed in ohmic contact with the n-type layer 12 and the p-type layer 13, respectively.

The light-emitting layer 11 can have either a single quantum well structure or a multiple quantum well (MQW) structure (typically, including 2 to 10 quantum well layers, and not more than 20 layers). For the MQW structure, the light-emitting layer 11 includes quantum well layers with a thickness of, for example, 1 atom to 100 nm (typically, 1 to 10 nm) and barrier layers with a thickness of 1 atom to 200 nm (typically, 3 to 50 nm). The quantum well layers and the barrier layers can be formed by adjusting the composition of AlGaInN according to emission wavelength (for example, the indium content of a quantum well layer having an emission wavelength corresponding to green light is typically 18% to 30%). As a typical example, the light-emitting layer 11 has an InGaN/GaN-based MQW structure including InGaN layers (quantum well layers) and GaN layers (barrier layers) that are alternately stacked.

Figure 2:
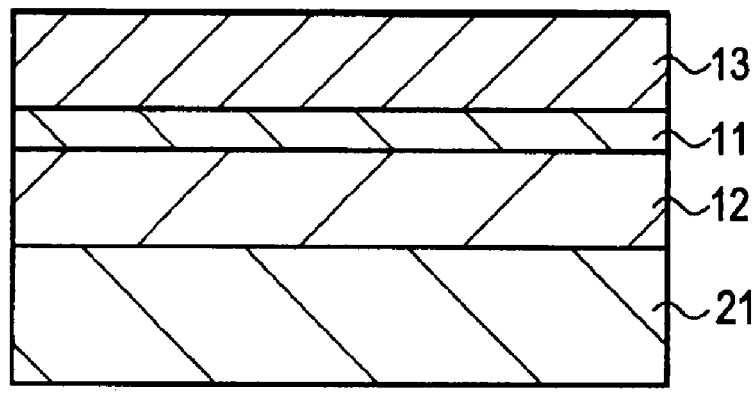
FIG. 2 is a sectional view illustrating a method for producing the GaN-based light-emitting diode according to the first embodiment of the present invention.

Referring to FIG. 2, the GaN-based light-emitting diode can be readily produced by sequentially growing the n-type layer 12, the light-emitting layer 11, and the p-type layer 13 on, for example, a vicinal substrate 21 using a technique such as MOCVD. Alternatively, the p-type layer 13, the light-emitting layer 11, and the n-type layer 12 can be sequentially grown on the vicinal substrate 21 in the above order. The vicinal substrate 21 used can be, for example, a sapphire, SiC, or GaN substrate having a main surface inclined at an angle θ of 0.25° to 2°, preferably, for example, 0.30 to 10, with respect to the c-plane.

The GaN-based light-emitting diode according to the first embodiment is driven by supplying current while modulating the luminance thereof with current density within the range of 20 A/cm$^2$ or less. This significantly reduces variations in the emission wavelength of the GaN-based light-emitting diode with drive current density. The luminance modulation with current density can be optionally combined with luminance modulation by pulse driving (such as PWM or PDM).

Example

Figure 3:
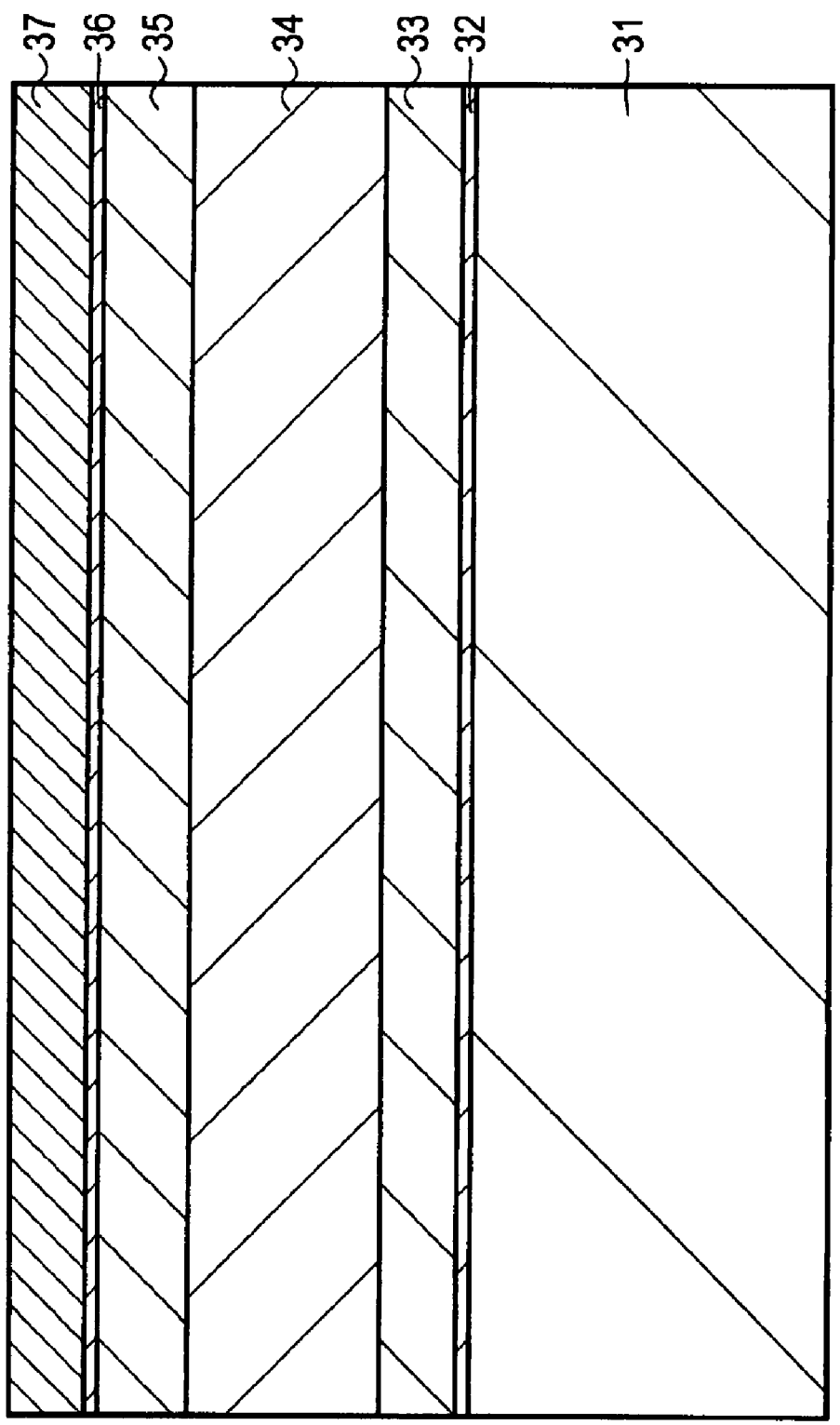
FIG. 3 is a sectional view illustrating a method for producing a GaN-based light-emitting diode in an example of the present invention.

Referring to FIG. 3, vicinal sapphire substrates 31 having main surfaces inclined at angles θ of 0.2°, 0.3°, 0.4°, and 0.6° with respect to the c-plane were used as the vicinal substrate 21, and GaN-based semiconductor layers were grown thereon to form light-emitting diode structures.

In FIG. 3, each vicinal sapphire substrate 31 was introduced into a reactor of an MOCVD apparatus. A surface of the vicinal sapphire substrate 31 was cleaned in a hydrogen atmosphere at a substrate temperature of 1,050° C. for ten minutes. The substrate temperature was then lowered to 500° C. Supply of ammonia ($NH_3$) into the reactor as a nitrogen (N) source was started, and trimethylgallium (TMG) was supplied as a gallium (Ga) source to deposit a low-temperature-grown GaN buffer layer 32 to a thickness of 20 nm. After the supply of TMG was stopped, the substrate temperature was raised to 1,020° C. with ammonia being supplied. The supply of TMG was then restarted, so that a GaN layer 33 started to be grown. When the GaN layer 33 had been grown to a thickness of 1 μm, monosilane was supplied as a silicon (Si) source to grow a silicon-doped n-type GaN layer 34 to a thickness of 2 μm. The typical growth rate of the GaN layer 33 and the n-type GaN layer 34 was 4 μm/h, and the doping concentration of silicon was adjusted to about $5\times10^{18}$/cm$^3$. After the supply of TMG and monosilane was stopped, the carrier gas was changed from hydrogen to nitrogen while the substrate temperature was lowered to about 700° C.

Figure 4:
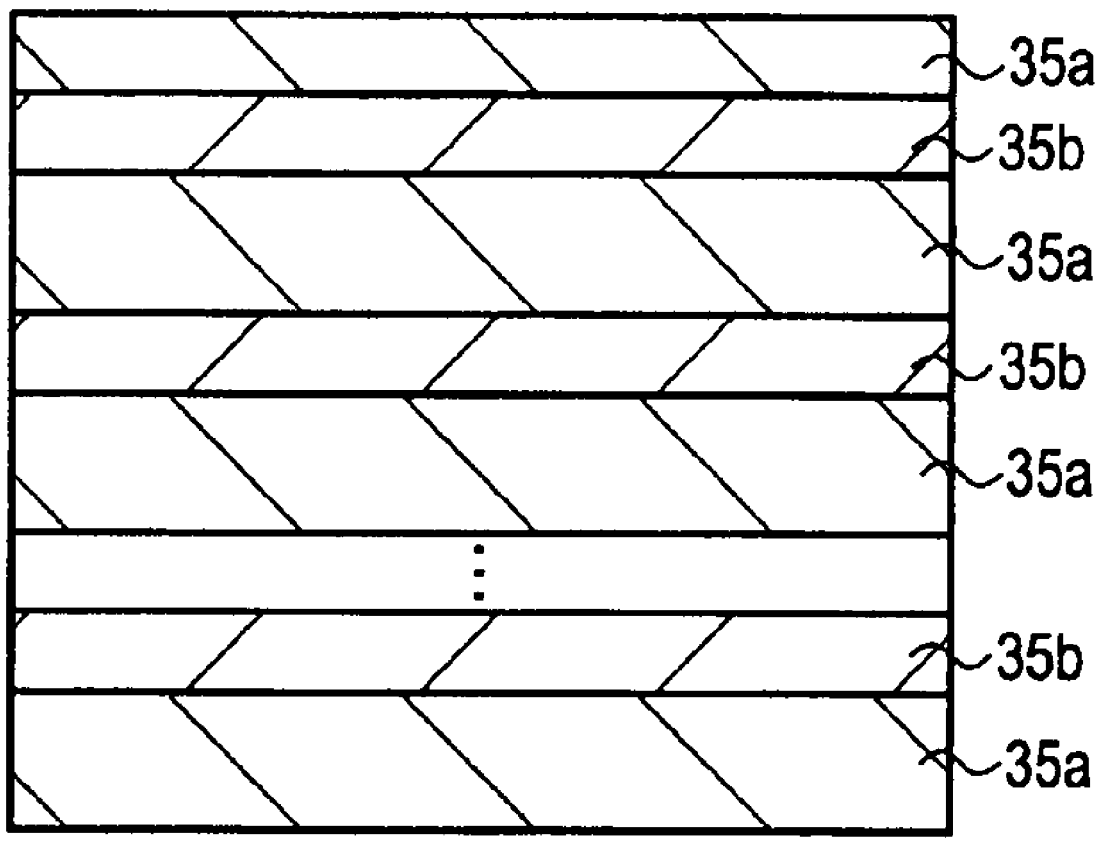
FIG. 4 is another sectional view illustrating the method for producing a GaN-based light-emitting diode in the example of the present invention.

Next, an InGaN/GaN-based MQW light-emitting layer 35 was grown on the n-type GaN layer 34 as described below. Referring to FIG. 4, after the substrate temperature stabilized, triethylgallium (TEG) started to be supplied as a gallium source to start growth of a GaN layer 35a, serving as a barrier layer, on the n-type GaN layer 34. When the GaN layer 35a had been grown to a predetermined thickness, trimethylindium (TMI) was supplied as an indium (In) source to grow an InGaN layer 35b, serving as a quantum well layer, to a predetermined thickness. The supply of TMI was then stopped to grow another GaN layer 35a. In this example, a total of nine InGaN layers 35b were grown, each containing about 23% indium and having a thickness of 3 nm, and the GaN layers 35a each had a thickness of 15 nm. The growth temperature used for the vicinal sapphire substrates 31 with angles θ of 0.3°, 0.4°, and 0.6° was 10° C. lower than that used for the vicinal sapphire substrate 31 with an angle θ of 0.2° because the amount of indium trapped in the growing layers varied with the inclination angles θ of the vicinal sapphire substrates 31.

The GaN layers 35a and the InGaN layers 35b were successively grown at constant temperature in this example, although they can also be grown at varying growth temperatures or intermittently. In addition, the GaN layers 35a, serving as barrier layers, can have either a periodic structure or an aperiodic structure.

After the final (topmost) GaN layer 35a was grown to a thickness of 5 nm, the substrate temperature was raised to 850° C. Referring back to FIG. 3, trimethylaluminum (TMA) and bis(cyclopentadienyl)magnesium ($CP_2Mg$) were supplied as an aluminum (AL) source and a magnesium (Mg) source, respectively, to grow a magnesium-doped p-type AlGaN layer 36 to a thickness of 20 nm. After the growth of the p-type AlGaN layer 36, the supply of the sources other than ammonia and the carrier gas, namely, nitrogen, was stopped. The aluminum concentration of the p-type AlGaN layer 36 was adjusted to 15%, and the magnesium doping concentration thereof was adjusted to $5\times10^{19}$/cm$^3$. The carrier gas was then changed to hydrogen while the substrate temperature was raised to 900° C. TMG and $CP_2Mg$ started to be supplied to grow a magnesium-doped p-type GaN layer 37 to a thickness of 180 nm. The magnesium doping concentration of the p-type GaN layer 37 was adjusted to $1\times10^{20}$/cm$^3$.

Subsequently, the substrate temperature was lowered to 600° C. with only ammonia and the carrier gas being supplied. After the supply of ammonia was stopped, the wafer, namely, the vicinal sapphire substrate 31 on which a light-emitting diode structure including the GaN-based semiconductor layers was formed, was removed from the MOCVD apparatus at not more than 100° C.

The removed wafer was annealed in a nitrogen atmosphere at 800° C. for ten minutes to activate the p-type dopant of the p-type AlGaN layer 36 and the p-type GaN layer 37.

Figure 5:
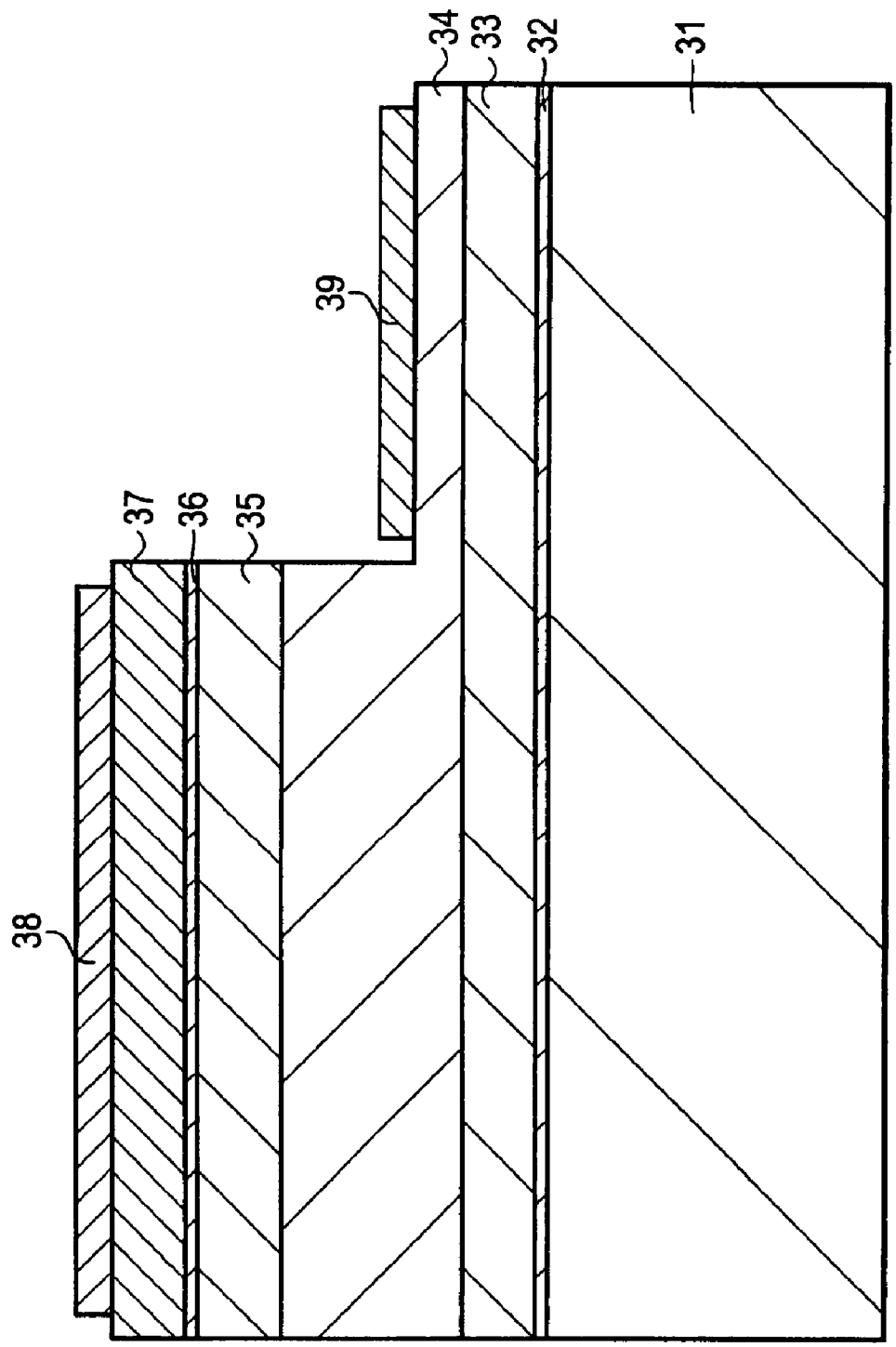
FIG. 5 is another sectional view illustrating the method for producing a GaN-based light-emitting diode in the example of the present invention.

Referring to FIG. 5, a predetermined resist pattern (not shown) was formed on the p-type GaN layer 37 by lithography and was used as a mask to perform mesa etching of an upper portion of the n-type GaN layer 34, the InGaN/GaN-based MQW light-emitting layer 35, the p-type AlGaN layer 36, and the p-type GaN layer 37 by, for example, reactive ion etching (RIE) using a chlorine-based etchant gas. A p-type electrode 38 was then formed on the mesa portion of the p-type GaN layer 37 by, for example, a lift-off process. The p-type electrode 38 was formed of a nickel-gold film. An n-type electrode 39 was then formed on a portion of the n-type GaN layer 34 adjacent to the mesa portion. The n-type electrode 39 was formed of a titanium-aluminum film.

Next, the wafer was cut into chips by, for example, cleavage.

The light-emitting diode chips can optionally be resin-molded or mounted on packages having lead frames and reflective mirrors.

Figure 6:
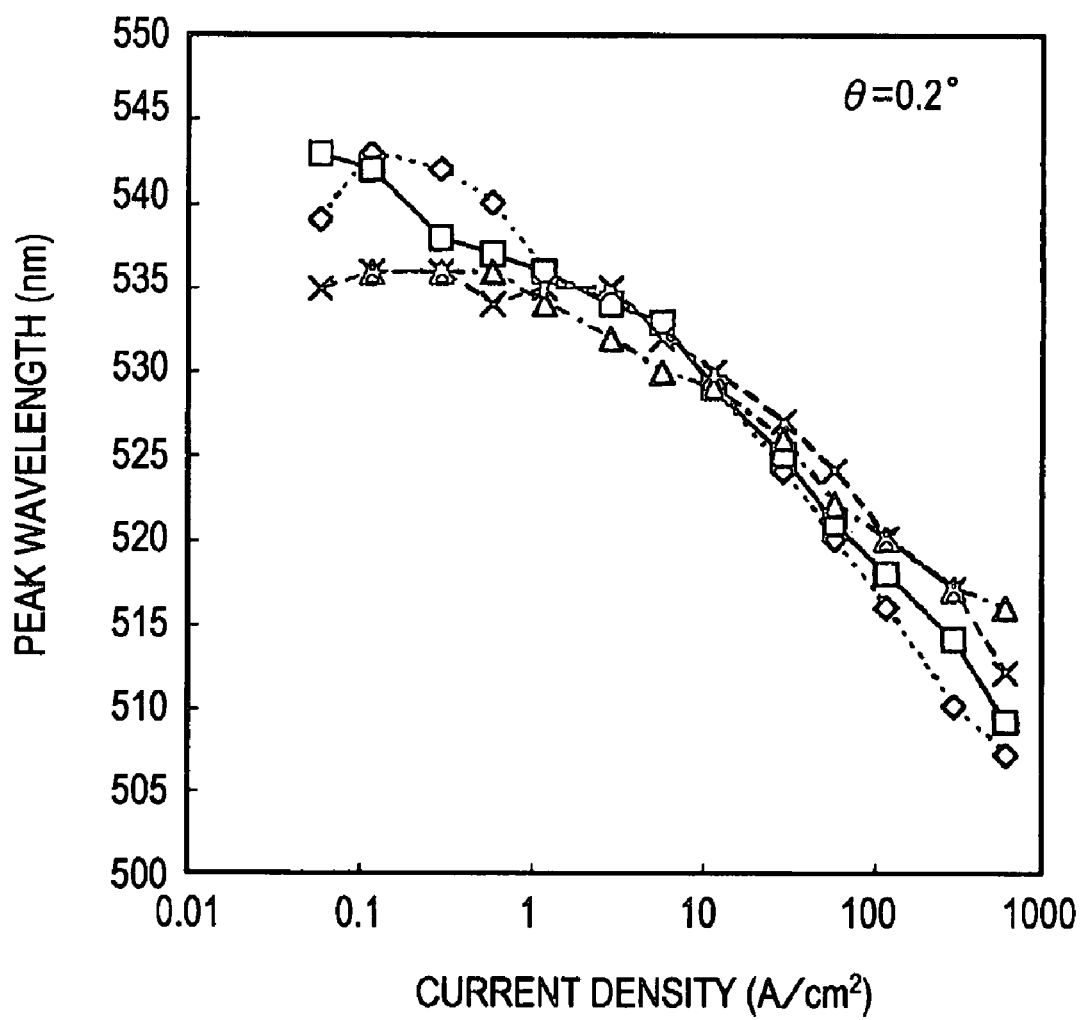
FIG. 6 is a graph showing the current density dependence of the emission peak wavelength of a GaN-based light-emitting diode of a comparative example.
Figure 7:
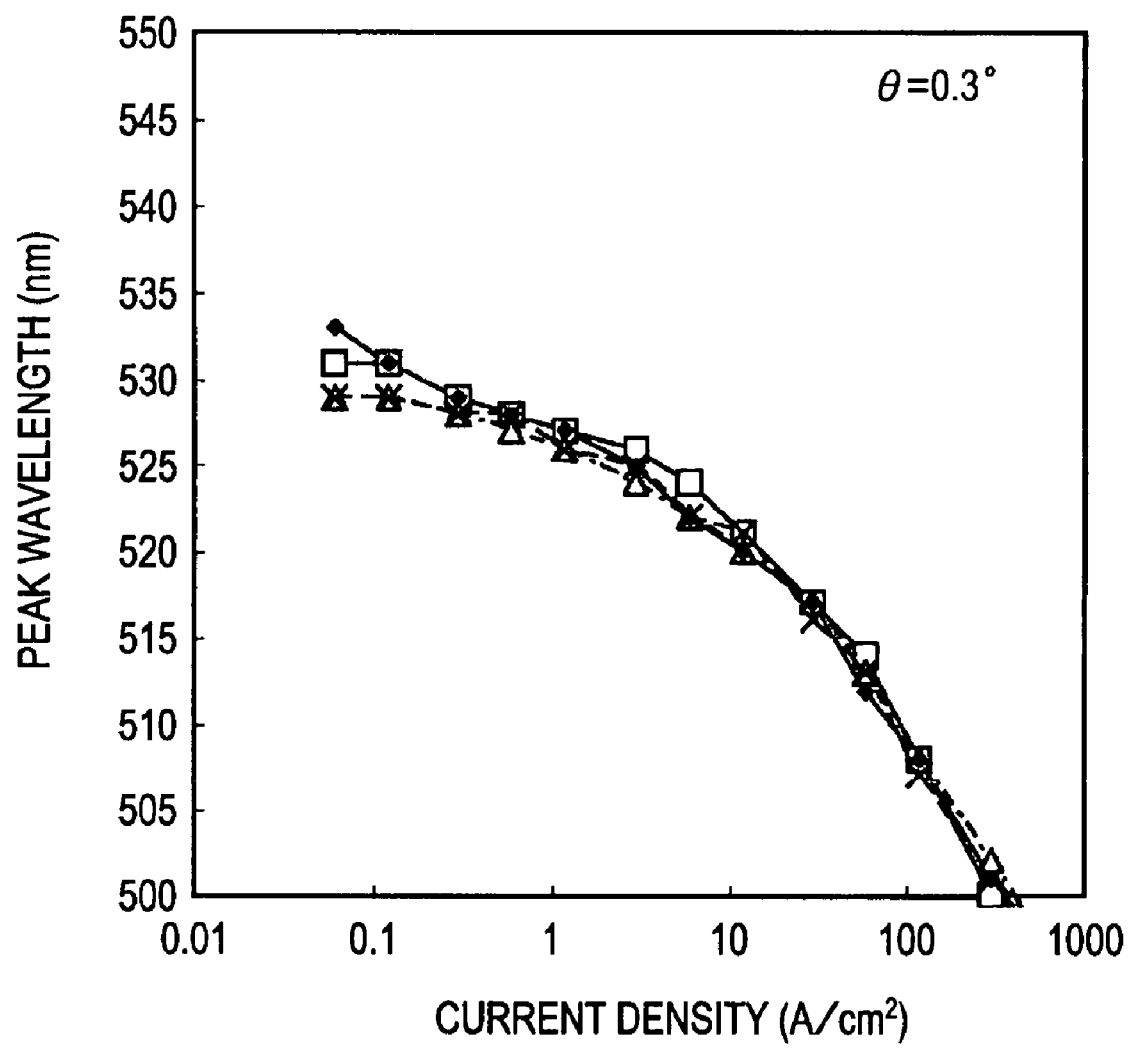
FIG. 7 is a graph showing the current density dependence of the emission peak wavelength of a GaN-based light-emitting diode of the example of the present invention.
Figure 8:
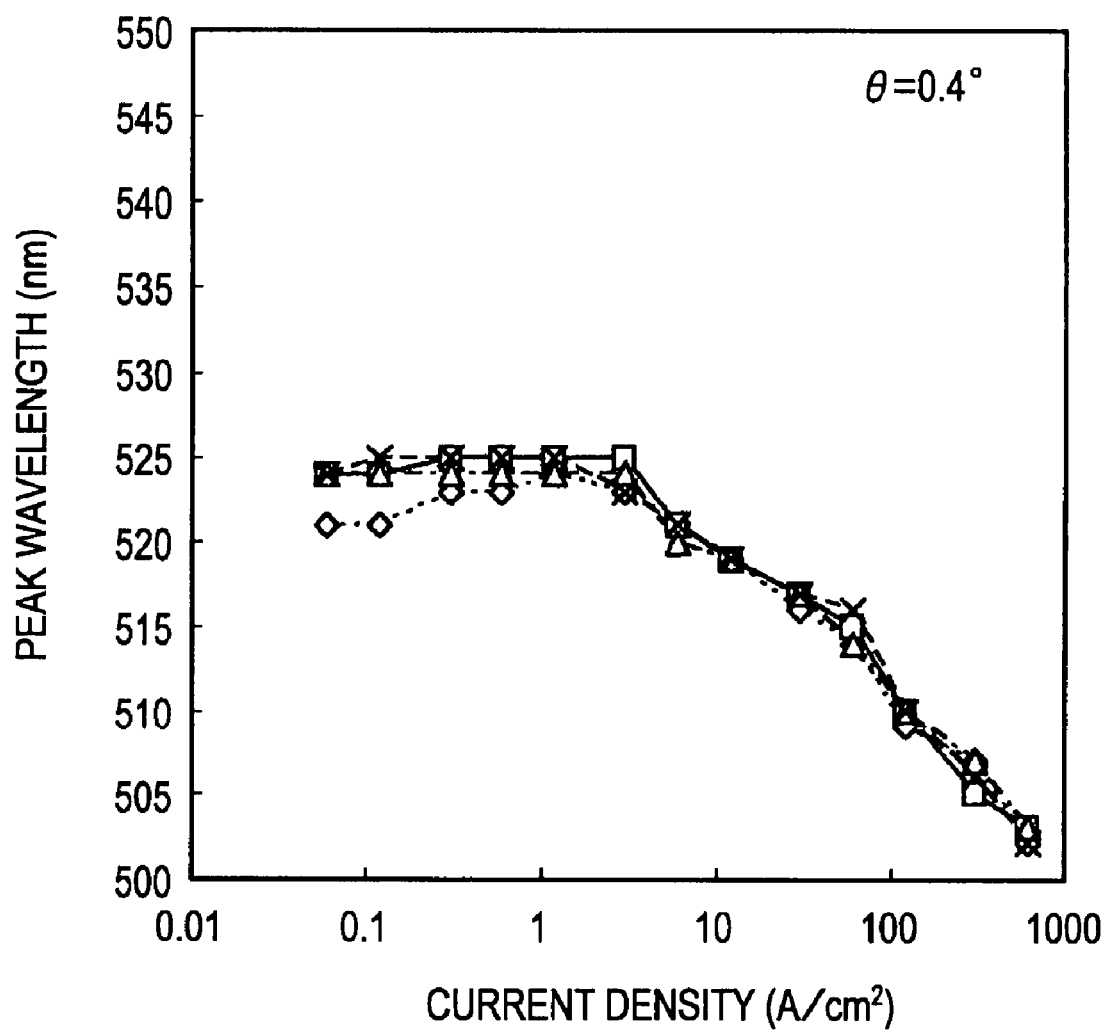
FIG. 8 is a graph showing the current density dependence of the emission peak wavelength of another GaN-based light-emitting diode of the example of the present invention.
Figure 9:
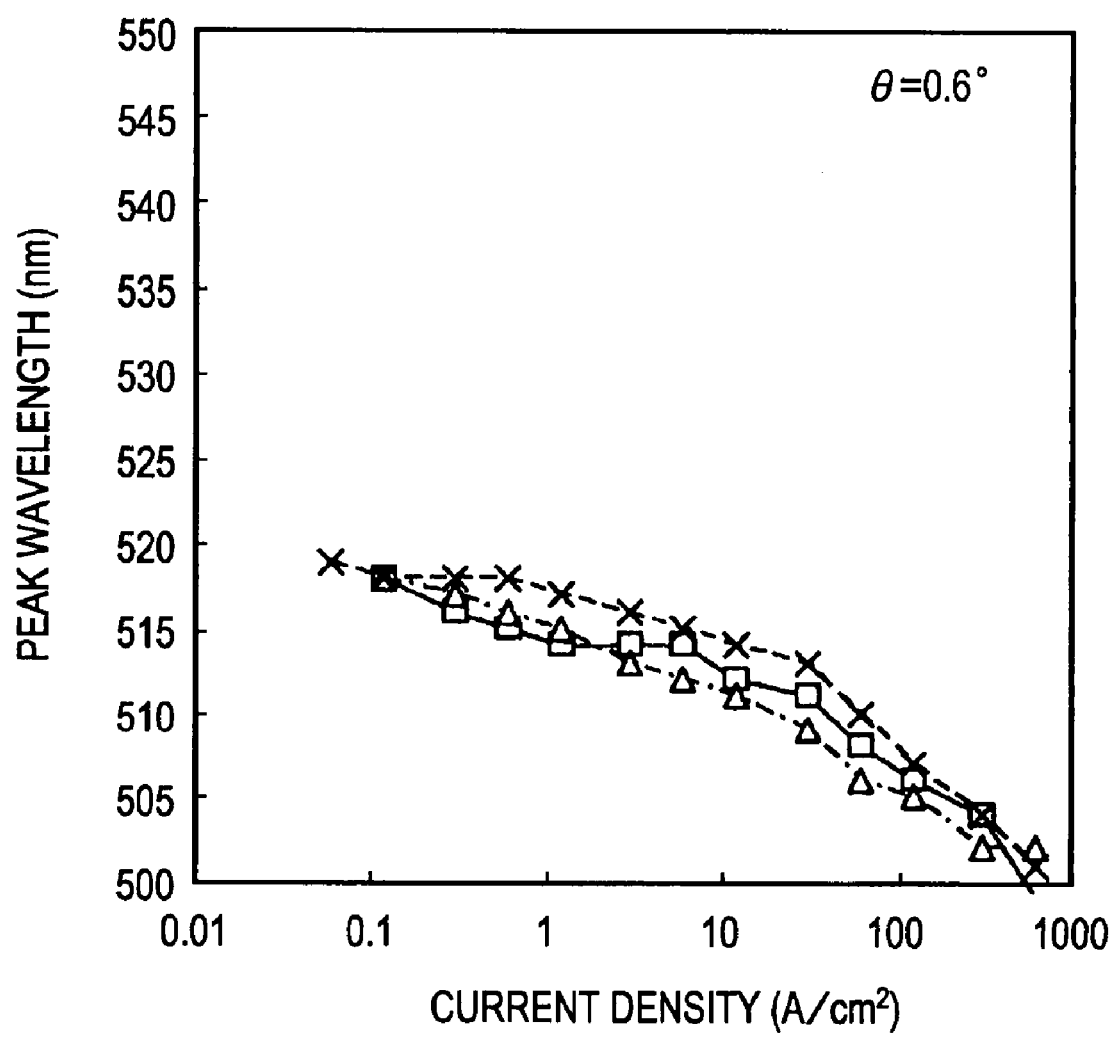
FIG. 9 is a graph showing the current density dependence of the emission peak wavelength of another GaN-based light-emitting diode of the example of the present invention.
Figure 10:
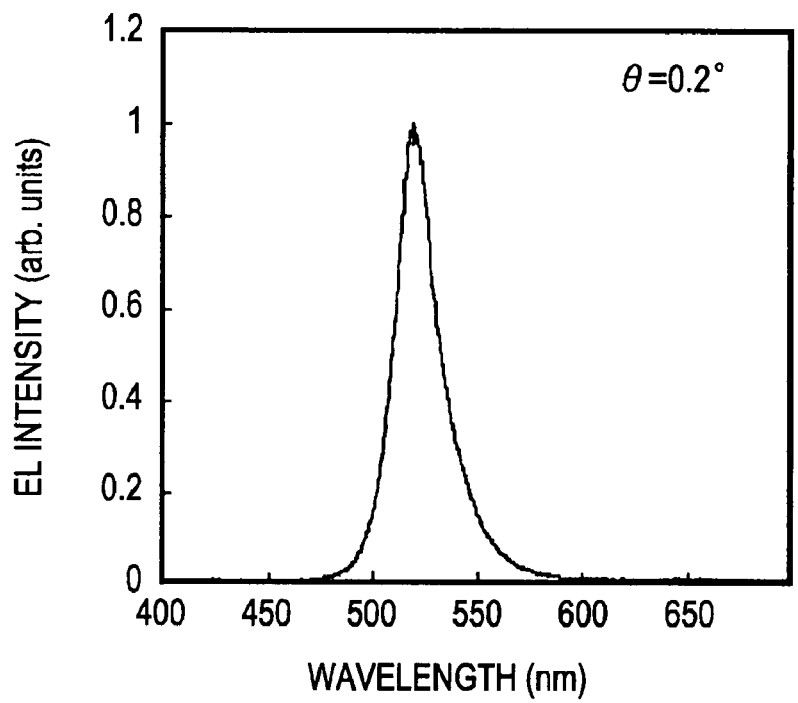
FIG. 10 is a graph showing an electroluminescence spectrum of the GaN-based light-emitting diode of the comparative example.
Figure 11:
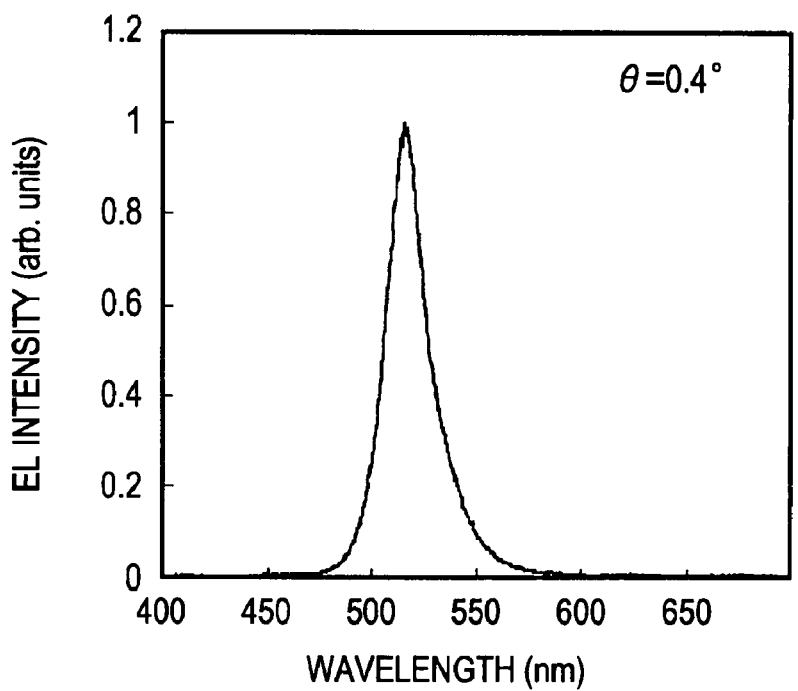
FIG. 11 is a graph showing an electroluminescence spectrum of the GaN-based light-emitting diode of the example of the present invention.

FIGS. 6 to 9 show measurements of the current density dependence of the emission peak wavelength of the GaN-based light-emitting diodes in the current density range of 0.06 to 600 A/cm². As described above, the GaN-based light-emitting diodes were produced by forming the light-emitting layer structures including the GaN-based semiconductor layers grown on the vicinal sapphire substrates 31 with angles θ of 0.2°, 0.3°, 0.4°, and 0.6°. For θ=0.2°, as shown in FIG. 6, large wavelength shifts approaching 40 nm were observed in the above current density range. For θ=0.3°, as shown in FIG. 7, shifts of only about −3 nm, about −4 nm, about −7 nm, and about −10 nm were observed at 2 A/cm², 5 A/cm², 10 A/cm², and 20 A/cm², respectively. For θ=0.4°, as shown in FIG. 8, no wavelength shift was observed at up to 2 A/cm², and shifts of only about −4 nm, about −5 nm, and about −7 nm were observed at 5 A/cm², 10 A/cm², and 20 A/cm², respectively. For θ=0.6°, as shown in FIG. 9, shifts of only about −5 nm and about −7 nm were observed at 10 A/cm² and 20 A/cm², respectively. Although no data is shown, large wavelength shifts similar to those for θ=0.2° were observed for θ=0° (not inclined) and 0.1°, and small wavelength shifts similar to those for θ=0.6° were observed at low current density for θ=1°. This effect seems to be associated with the conditions of atomic steps on the surfaces of the growing InGaN layers 35b. A similar effect can also be provided using other types of substrates having similar vicinal surfaces, including a vicinal SiC substrate and a vicinal GaN substrate. FIGS. 10 and 11 show electroluminescence (EL) spectra of the GaN-based light-emitting diodes with angles θ of 0.2° and 0.4°, respectively, which had peak wavelengths of about 520 nm and about 515 nm, respectively.

In general, the current density is preferably controlled within the range of, for example, 2 A/cm² or less to drive a GaN-based light-emitting diode without causing any wavelength shift. The current density is preferably controlled within the range of, for example, 5 A/cm² or less, or 10 A/cm² or less, to suppress a wavelength shift to such a level that the shift is hardly recognized by the human eye (e.g., Δu'v'<0.01). The current density is preferably controlled within the range of, for example, 20 A/cm² or less if some color difference is recognizable but is not serious for practical use or if slight color compensation is used in combination. The problem of color shift can be suppressed if the luminance is modulated with variations in current density within such ranges. In addition, a wider dynamic range of luminance than before can be achieved in combination with pulse driving (such as PWM or PDM). This feature is advantageous for displays, particularly, high-quality display applications featuring a wide color reproduction range and a wide dynamic range.

As described above, the GaN-based light-emitting diode according to the first embodiment includes a light-emitting layer having a main surface inclined at an angle θ of 0.25° to 2°, preferably, for example, 0.3° to 1°, with respect to the c-plane, and the luminance of the light-emitting diode is modulated with current density within the range of 20 A/cm² or less. This significantly reduces variations in the emission wavelength of the GaN-based light-emitting diode with drive current density, thus stabilizing the emission wavelength. In particular, the emission wavelength can also be stabilized for emission of green light, which is significantly susceptible to the phenomenon of a wavelength shift with current density. Thus, the GaN-based light-emitting diode and the method for driving the diode can be applied to green light-emitting diodes to provide a light-emitting diode display capable of high-quality image display.

A second embodiment of the present invention will be described. In the second embodiment, a transmissive liquid crystal display including a light-emitting diode backlight as a white light source will be described. The GaN-based light-emitting diode and the method for driving the diode according to the first embodiment are applied to green light-emitting diodes of the light-emitting diode backlight.

Figure 12:
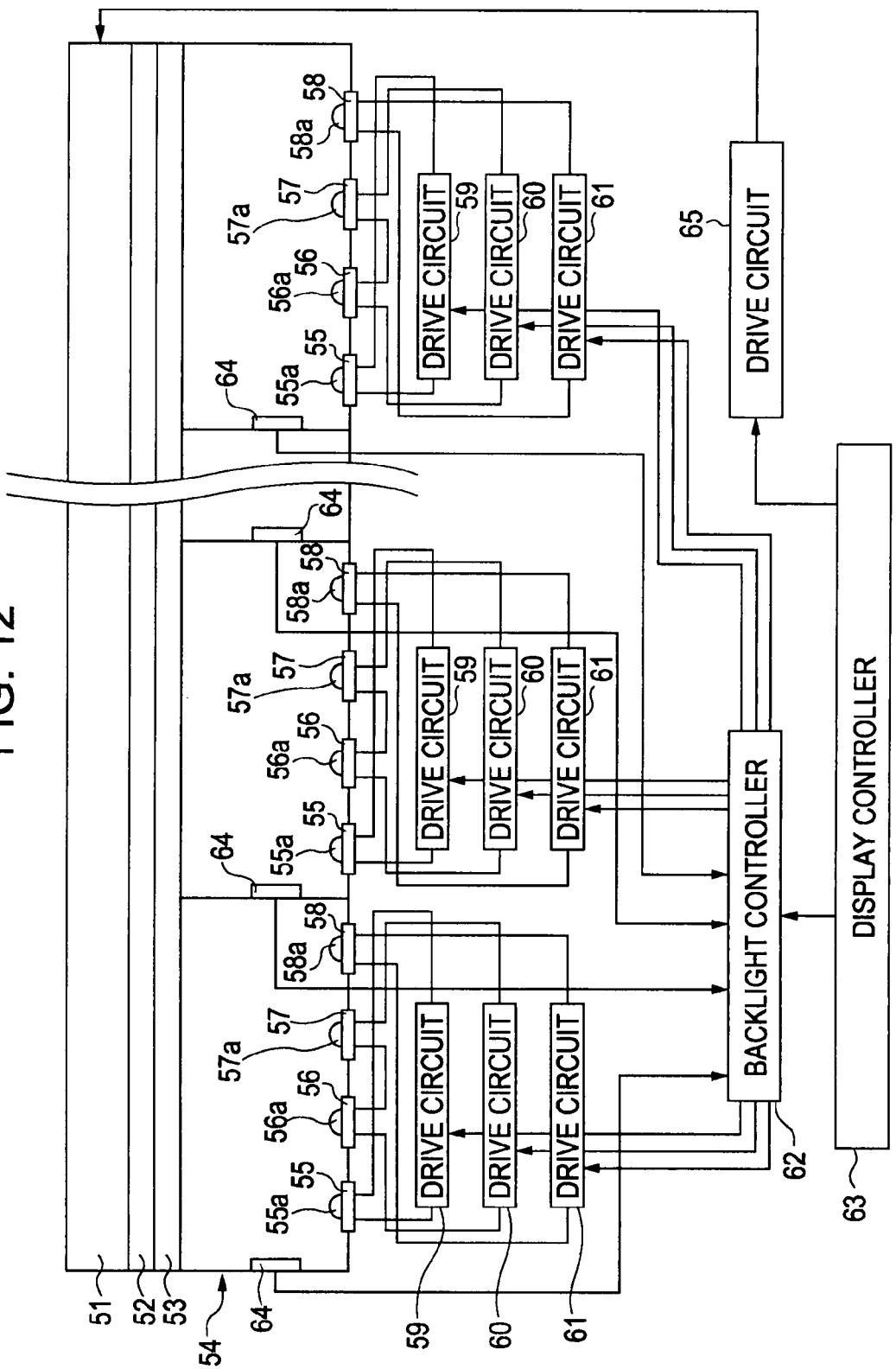
FIG. 12 is a schematic diagram of a transmissive liquid crystal display according to a second embodiment of the present invention.

FIG. 12 illustrates the transmissive liquid crystal display according to the second embodiment.

In FIG. 12, the transmissive liquid crystal display includes a liquid crystal panel 51 and a liquid crystal display backlight 54 disposed on the rear of the liquid crystal panel 51 with a prism sheet 52 and a diffuser 53 disposed therebetween.

The liquid crystal display backlight 54 includes a matrix of cells, each including a red light-emitting diode 55, two green light-emitting diodes 56 and 57, and a blue light-emitting diode 58. The numbers of cells in the longitudinal and lateral directions are selected according to need. The red light-emitting diode 55, the green light-emitting diode 56, the green light-emitting diode 57, and the blue light-emitting diode 58 have convex lenses 55a, 56a, 57a, and 58a, respectively, which may be replaced with concave lenses or other types of lenses with complicated shapes according to applications and optical design. The red light-emitting diode 55 used is, for example, an AlGaInP-based light-emitting diode. The green light-emitting diodes 56 and 57 used are GaN-based light-emitting diodes according to the first embodiment. The blue light-emitting diode 58 used is, for example, a GaN-based light-emitting diode. The red light-emitting diode 55, the green light-emitting diodes 56 and 57, and the blue light-emitting diode 58 are driven by drive circuits 59, 60, and 61, respectively. The drive circuits 59, 60, and 61 of each cell are controlled by a backlight controller 62 which in turn is controlled by a display controller 63. Each cell includes an optical sensor 64 for sensing the luminous intensity of the red light-emitting diode 55, the green light-emitting diodes 56 and 57, and the blue light-emitting diode 58. The output of the optical sensor 64 is fed to the backlight controller 62.

The liquid crystal panel 51 is driven by a drive circuit 65 which in turn is controlled by the display controller 63.

In this case, the luminance of the GaN-based light-emitting diodes according to the first embodiment, used as the green light-emitting diodes 56 and 57, is modulated with current density within the range of 20 A/cm$^2$ or less, preferably 10 A/cm$^2$ or less. On the other hand, the drive current density of the red light-emitting diode 55 and the blue light-emitting diode 58 is not limited to the range of 20 A/cm$^2$ or less.

This transmissive liquid crystal display controls the luminance of the light-emitting diode backlight 54 according to, for example, the brightness of the entire screen and bright and dark regions in the screen to achieve an extended dynamic range and reduced power consumption. While the screen luminance is often controlled by PWM in the related art, the transmissive liquid crystal display according to this embodiment can employ current amplitude modulation within the current density range of 20 A/cm$^2$ or less, preferably 10 A/cm$^2$ or less, for control of the red light-emitting diode 55, green light-emitting diodes 56 and 57, and blue light-emitting diode 58 of the cells of the light-emitting diode backlight 54. The transmissive liquid crystal display can therefore provide a significantly extended dynamic range by luminance modulation in combination with PWM. In addition, the transmissive liquid crystal display can achieve a reduction in the pulse drive frequency used for the same dynamic range.

A third embodiment of the present invention will be described. In the third embodiment, a projection display including red, green, and blue light-emitting diode light sources and light valves including transmissive liquid crystal panels. The green light-emitting diode light source includes GaN-based light-emitting diodes according to the first embodiment.

Figure 13:
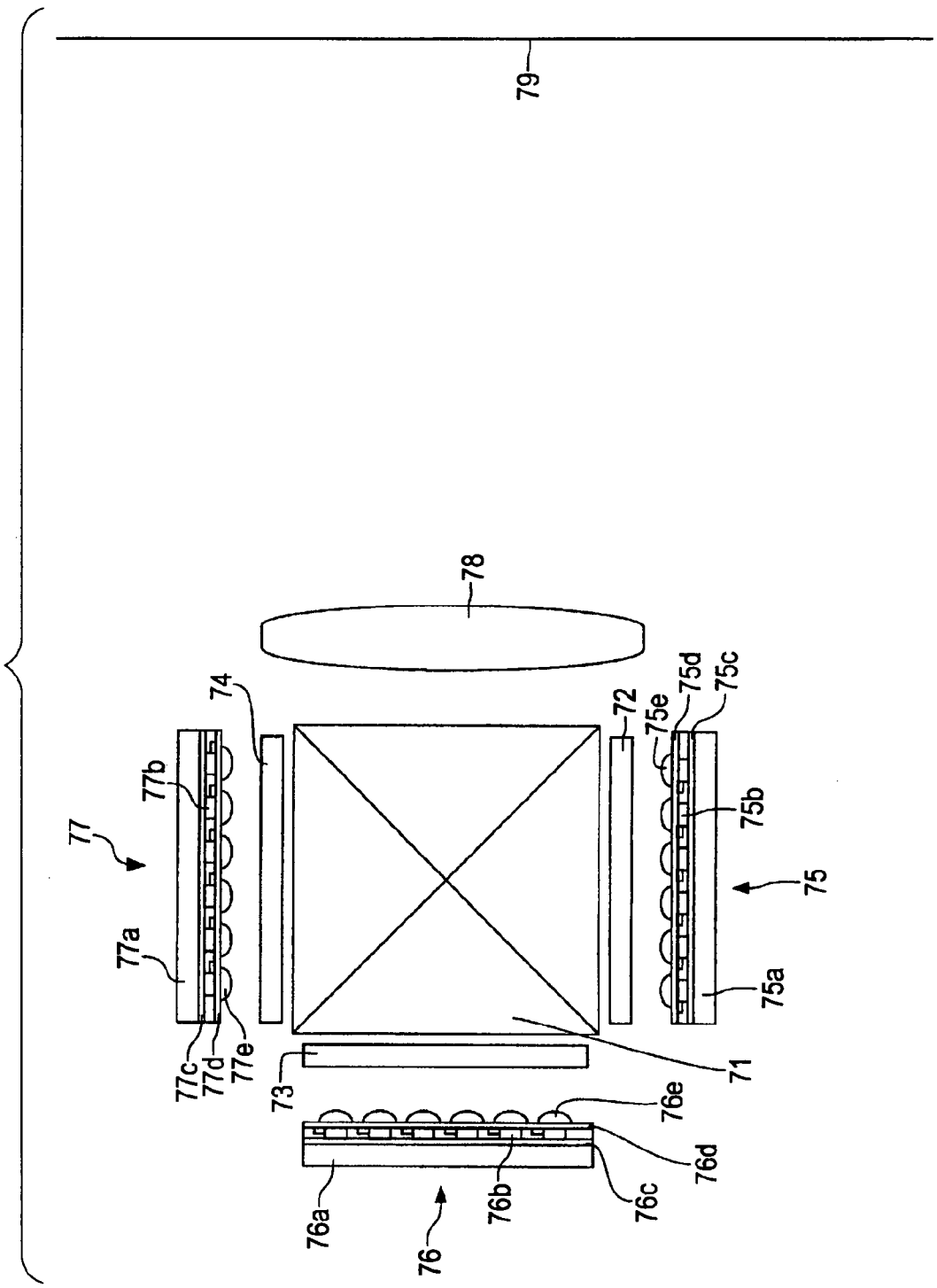
FIG. 13 is a schematic diagram of a projection display according to a third embodiment of the present invention.

FIG. 13 illustrates the projection display according to the third embodiment.

In FIG. 13, the projection display includes a dichroic prism 71, liquid crystal panels 72, 73, and 74 adjacent to three respective surfaces of the dichroic prism 71, and a projection lens 78 disposed opposite another surface of the dichroic prism 71. The liquid crystal panels 72, 73, and 74 are high-temperature polycrystalline silicon thin film transistor (TFT) liquid crystal panels. A red light-emitting diode panel 75 is disposed behind the liquid crystal panel 72. A green light-emitting diode panel 76 is disposed behind the liquid crystal panel 73. A blue light-emitting diode panel 77 is disposed behind the liquid crystal panel 74.

The red light-emitting diode panel 75 includes red light-emitting diodes 75b arranged in a matrix on a substrate 75a. The numbers of light-emitting diodes 75b in the longitudinal and lateral directions are selected according to need. The light-emitting diodes 75b used are, for example, AlGaInP-based light-emitting diodes. The p-type layer sides of the light-emitting diodes 75b are connected to wiring electrodes 75c, and the n-type layer sides thereof are connected to transparent electrodes 75d. Convex lenses 75e are disposed on the transparent electrodes 75d at positions corresponding to the light-emitting diode 75b. The green light-emitting diode panel 76 includes green light-emitting diodes 76b arranged in a matrix on a substrate 76a. The numbers of light-emitting diodes 76b in the longitudinal and lateral directions are selected according to need. The green light-emitting diodes 76b used are GaN-based light-emitting diodes according to the first embodiment. The p-type layer sides of the light-emitting diodes 76b are connected to wiring electrodes 76c, and the n-type layer sides thereof are connected to transparent electrodes 76d. Convex lenses 76e are disposed on the transparent electrodes 76d at positions corresponding to the light-emitting diode 76b. The blue light-emitting diode panel 77 includes blue light-emitting diodes 77b arranged in a matrix on a substrate 77a. The numbers of light-emitting diodes 77b in the longitudinal and lateral directions are selected according to need. The light-emitting diodes 77b used are, for example, GaN-based light-emitting diodes. The p-type layer sides of the light-emitting diodes 77b are connected to wiring electrodes 77c, and the n-type layer sides thereof are connected to transparent electrodes 77d. Convex lenses 77e are disposed on the transparent electrodes 77d at positions corresponding to the light-emitting diode 77b.

The liquid crystal panels 72, 73, and 74 of the projection display control transmission of red light emitted from the red light-emitting diode panel 75, green light emitted from the green light-emitting diode panel 76, and blue light emitted from the blue light-emitting diode panel 77, respectively. The dichroic prism 71 then combines the red light, the green light, and the blue light to form an image which is projected onto a screen 79 through the projection lens 78.

In this case, the luminance of the GaN-based light-emitting diodes according to the first embodiment, used as the green light-emitting diodes 76b of the green light-emitting diode panel 76, is modulated with current density within the range of 20 A/cm$^2$ or less, preferably 10 A/cm$^2$ or less. On the other hand, the drive current density of the red light-emitting diodes 75b of the red light-emitting diode panel 75 and the blue light-emitting diodes 77b of the blue light-emitting diode panel 77 is not limited to the range of 20 A/cm$^2$ or less.

This projection display can be effectively driven by changing the brightness of the light sources according to screen brightness. The projection display can employ current amplitude modulation within the current density range of 20 A/cm$^2$ or less, preferably 10 A/cm$^2$ or less, for control of the red light-emitting diodes 75b of the red light-emitting diode panel 75, the green light-emitting diodes 76b of the green light-emitting diode panel 76, and the blue light-emitting diodes 77b of the blue light-emitting diode panel 77. The projection display can therefore provide a significantly extended dynamic range in combination with PWM. In addition, the projection display can achieve a reduction in the pulse drive frequency used for the same dynamic range.

A fourth embodiment of the present invention will be described. In the fourth embodiment, a projection display including red, green, and blue light-emitting diode light sources and a light valve including a DMD. The green light-emitting diode light source includes GaN-based light-emitting diodes according to the first embodiment.

Figure 14:
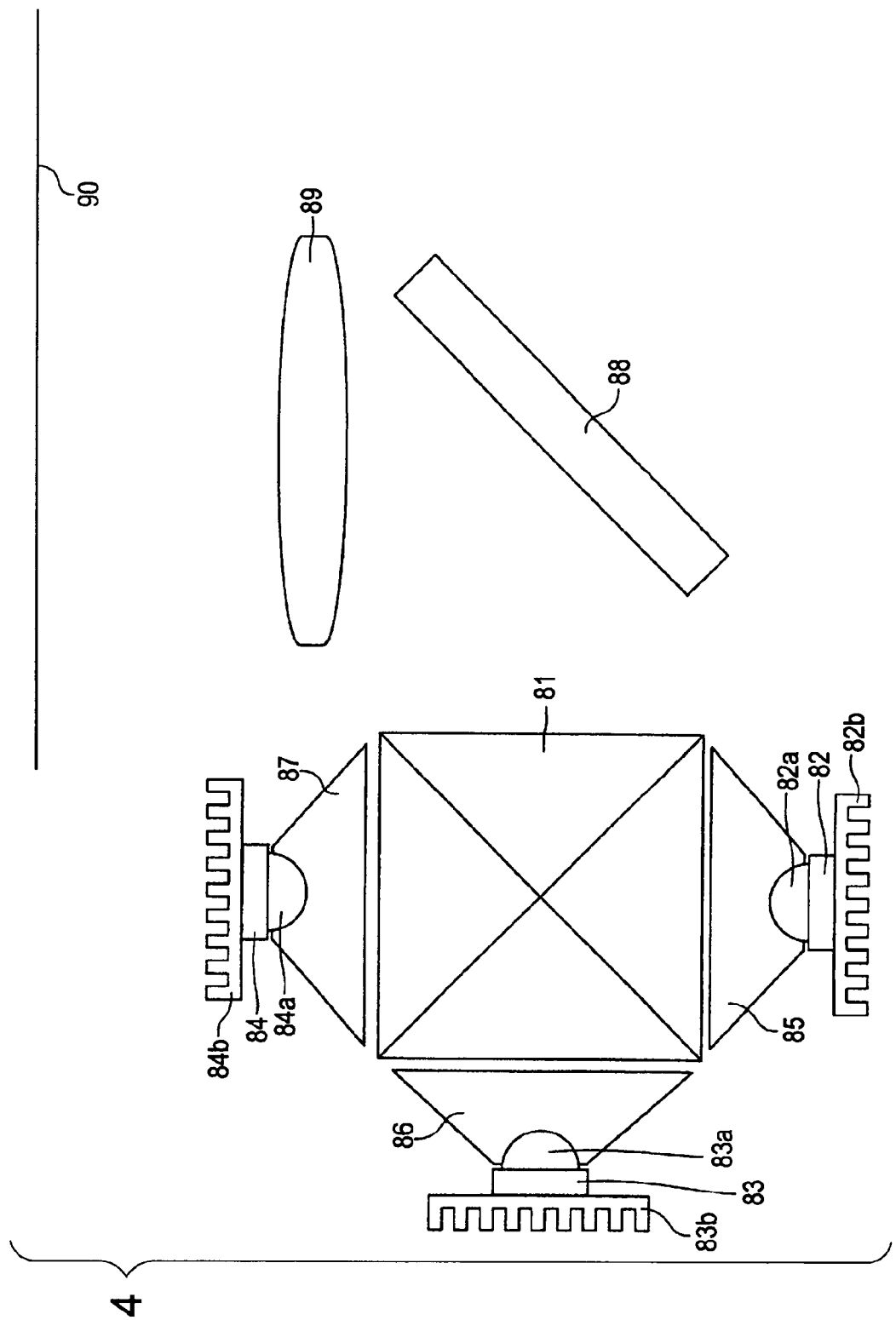
FIG. 14 is a schematic diagram of a projection display according to a fourth embodiment of the present invention.

FIG. 14 illustrates the projection display according to the fourth embodiment.

In FIG. 14, the projection display includes a red power light-emitting diode 82, a green power light-emitting diode 83, and a blue power light-emitting diode 84 which are disposed opposite three respective surfaces of a dichroic prism 81. The red power light-emitting diode 82 used is, for example, an AlGaInP-based light-emitting diode. The green power light-emitting diode 83 used is a GaN-based light-emitting diode according to the first embodiment. The blue power light-emitting diode 84 used is, for example, a GaN-based light-emitting diode. The red power light-emitting diode 82 has a convex lens 82a on a light-emitting surface thereof and radiating fins 82b on the back surface thereof. Light emitted from the red power light-emitting diode 82 passes through the convex lens 82a and is projected onto the opposite surface of the dichroic prism 81 by a light guide member 85. The green power light-emitting diode 83 has a convex lens 83a on a light-emitting surface thereof and radiating fins 83b on the back surface thereof. Light emitted from the green power light-emitting diode 83 passes through the convex lens 83a and is projected onto the opposite surface of the dichroic prism 81 by a light guide member 86. The blue power light-emitting diode 84 has a convex lens 84a on a light-emitting surface thereof and radiating fins 84b on the back surface thereof. Light emitted from the blue power light-emitting diode 84 passes through the convex lens 84a and is projected onto the opposite surface of the dichroic prism 81 by a light guide member 87.

A DMD 88 is disposed opposite another surface of the dichroic prism 81. The dichroic prism 81 mixes red light emitted from the red power light-emitting diode panel 82, green light emitted from the green power light-emitting diode panel 83, and blue light emitted from the blue power light-emitting diode panel 84 into white light. The white light impinges on the DMD 88 to form an image which is projected onto a screen 90 through a projection lens 89.

In this case, the luminance of the GaN-based light-emitting diode according to the first embodiment, used as the green power light-emitting diode 83, is modulated with current density within the range of 20 A/cm$^2$ or less, preferably 10 A/cm$^2$ or less. On the other hand, the drive current density of the red power light-emitting diode 82 and the blue power light-emitting diode 84 is not limited to the range of 20 A/cm$^2$ or less.

In general, this type of projection display executes time division of red (R), blue (B), and green (G) signals if it uses a single-chip DMD. In addition, the projection display uses a much higher frequency for PWM if the DMD itself modulates the luminance of light sources to reproduce gradations by time division. In contrast, the projection display according to the fourth embodiment can modulate luminance by current amplitude modulation without the need for PWM. If PWM is used in combination, the projection display can achieve a significantly extended dynamic range and a reduction in pulse drive frequency.

A fifth embodiment of the present invention will be described.

Figure 15:
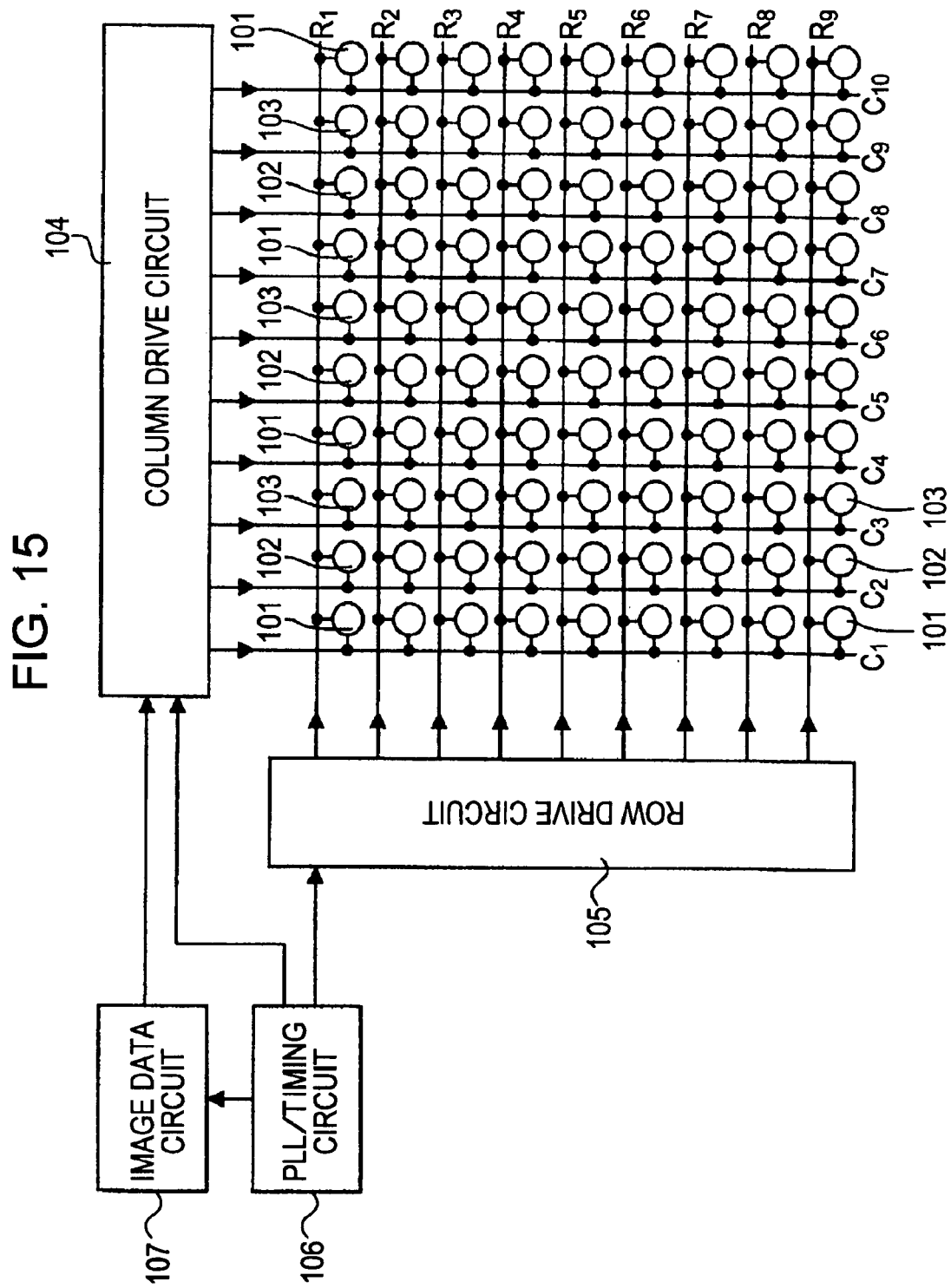
FIG. 15 is a schematic diagram of a passive-matrix light-emitting diode display according to a fifth embodiment of the present invention.

FIG. 15 illustrates a passive-matrix light-emitting diode display according to the fifth embodiment.

In FIG. 15, the passive-matrix light-emitting diode display includes a matrix of pixels including red light-emitting diodes 101, green light-emitting diodes 102, and blue light-emitting diodes 103. The red light-emitting diodes 101 used are, for example, AlGaInP-based light-emitting diodes. The green light-emitting diodes 102 used are GaN-based light-emitting diodes according to the first embodiment. The blue light-emitting diodes 103 used are, for example, GaN-based light-emitting diodes. The numbers of pixels in the longitudinal and lateral directions are selected according to need. Column selection lines (address lines) $C_1$ to $C_{10}$ (and later) are connected to a column drive circuit 104. Row selection lines (signal lines) $R_1$ to $R_9$ (and later) are connected to a row drive circuit 105. While a phase-locked loop (PLL)/timing circuit 106 controls the column drive circuit 104 and the row drive circuit 105 to select the pixels, an image data circuit 107 supplies RGB signals to the column drive circuit 104. A current supplied in response to the RGB signals drives the red light-emitting diodes 101, green light-emitting diodes 102, and blue light-emitting diodes 103 of the selected pixels. The scanning method used for driving the display is, for example, dot-sequential scanning or line-sequential scanning.

In this case, the luminance of the GaN-based light-emitting diodes according to the first embodiment, used as the green light-emitting diodes 102, is modulated with current density within the range of 20 A/cm$^2$ or less, preferably 10 A/cm$^2$ or less. On the other hand, the drive current density of the red light-emitting diodes 101 and the blue light-emitting diodes 103 is not limited to the range of 20 A/cm$^2$ or less.

This light-emitting diode display can employ PWM to reproduce in-screen luminance signals and amplitude modulation to adjust the brightness of the entire screen. Because the green light-emitting diodes 102 tend to vary significantly in emission wavelength with drive current density, the GaN-based light-emitting diodes according to the first embodiment are used as the green light-emitting diodes 102, and the luminance thereof is modulated with current density within the range of 20 A/cm$^2$ or less. Accordingly, variations in emission wavelength with current density can be suppressed in any of the red light-emitting diodes 101, the green light-emitting diodes 102, and the blue light-emitting diodes 103. The light-emitting diode display thus causes significantly less color variations in amplitude modulation.

A sixth embodiment of the present invention will be described.

Figure 16:
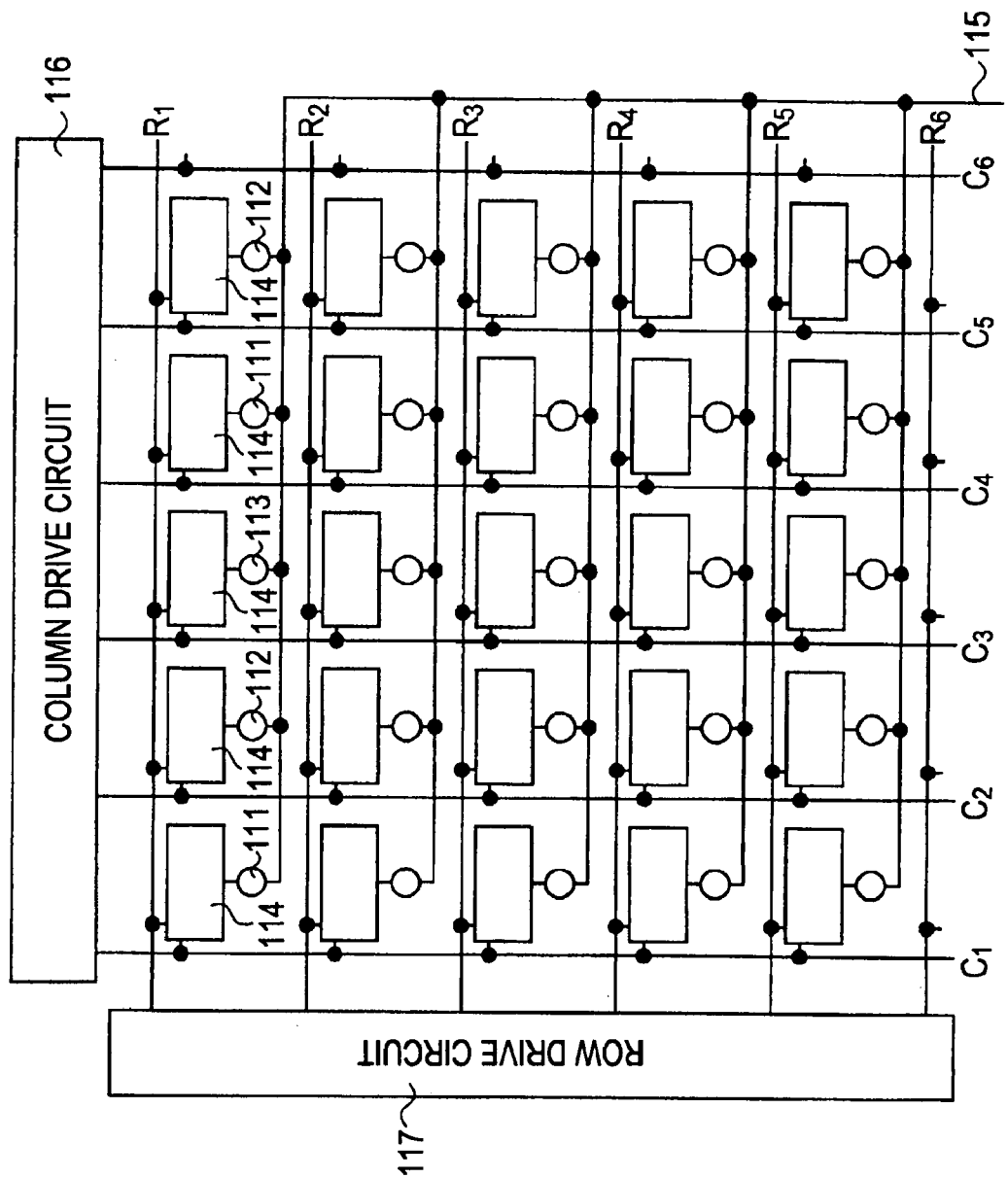
FIG. 16 is a schematic diagram of an active-matrix light-emitting diode display according to a sixth embodiment of the present invention.

FIG. 16 illustrates an active-matrix light-emitting diode display according to the sixth embodiment.

In FIG. 16, the active-matrix light-emitting diode display includes a matrix of pixels including red light-emitting diodes 111, green light-emitting diodes 112, blue light-emitting diodes 113, and active elements 114. The red light-emitting diodes 111 used are, for example, AlGaInP-based light-emitting diodes. The green light-emitting diodes 112 used are GaN-based light-emitting diodes according to the first embodiment. The blue light-emitting diodes 113 used are, for example, GaN-based light-emitting diodes. The numbers of pixels in the longitudinal and lateral directions are selected according to need. The n-type layer sides of the light-emitting diodes 111, 112, and 113 are connected to ground lines 115, and the p-type layer sides thereof are connected to the active elements 114. The active elements 114 are capable of driving the light-emitting diodes 111, 112, and 113 and include, for example, silicon integrated circuits. Column selection lines (address lines) $C_1$ to $C_6$ (and later) are connected to a column drive circuit 116. Row selection lines (signal lines) $R_1$ to $R_6$ (and later) are connected to a row drive circuit 117. The column drive circuit 116 and the row drive circuit 117 select the pixels to drive the active elements 114 of the selected pixels, so that a current supplied through the active elements 114 drives the red light-emitting diodes 111, green light-emitting diodes 112, and blue light-emitting diodes 113 of the pixels.

In this case, the luminance of the GaN-based light-emitting diodes according to the first embodiment, used as the green light-emitting diodes 112, is modulated with current density within the range of 20 A/cm$^2$ or less, preferably 10 A/cm$^2$ or less. On the other hand, the drive current density of the red light-emitting diodes 111 and the blue light-emitting diodes 113 is not limited to the range of 20 A/cm$^2$ or less.

While a passive-matrix light-emitting diode display is driven by, for example, dot-sequential scanning or line-sequential scanning, the above active-matrix light-emitting diode display enables simultaneous illumination of the pixels to reduce instantaneous peak luminance of the red light-emitting diodes 111, green light-emitting diodes 112, and blue light-emitting diodes 113 of the pixels. This contributes to a significant reduction in the amplitude of current supplied to the light-emitting diodes 111, 112, and 113 (for example, to roughly $\frac{1}{1,080}$ that of the case of line-sequential scanning for 1,080 lines). Thus, the method for driving light-emitting diodes according to the first embodiment, in which the luminance of the diodes is modulated at low current density, namely, within the current density range of 20 A/cm$^2$ or less, to suppress a wavelength shift, is effective for the active-matrix light-emitting diode display. The active elements 114 can be driven by current amplitude modulation, PWM, or the combination thereof. Active elements with low drive frequency can be used for the combination of simple current amplitude modulation and PWM because the combined modulation causes only slight color variations in comparison with PWM.

In addition, variations in screen luminance during manufacture can be corrected by measuring the variations and controlling the amplitude of current supplied to drive the light-emitting diodes 111, 112, and 113 of the individual pixels according to the measurement results. Furthermore, video signals can be reproduced only by PWM to prevent a decrease in gradation due to luminance correction and to simplify the signal processing.

The embodiments of the present invention have been described above in detail, although the invention is not limited to these embodiments. It should be understood by those skilled in the art that various modifications, combinations, sub-combinations and alterations may occur depending on design requirements and other factors insofar as they are within the scope of the appended claims or the equivalents thereof.

For example, the values, materials, structures, shapes, substrates, processes, and circuit configurations shown in the first to sixth embodiments are merely illustrative, and different values, materials, structures, shapes, substrates, processes, and circuit configurations can be employed according to need.

What is claimed is:

1. A method for driving a light-emitting diode including a p-type layer, an n-type layer, and a light-emitting layer disposed therebetween and having an indium-containing quantum well structure, each of the p-type layer, the n-type layer, and the light-emitting layer including a nitride-based group III-V compound semiconductor crystal having a wurtzite structure, the light-emitting layer having a main surface inclined at an angle of 0.25° to 2° with respect to a c-plane, the method comprising:
    modulating a luminance of the light-emitting diode with current density having a magnitude within a range of 20 A/cm$^2$ or less.

2. The method for driving the light-emitting diode according to claim 1, wherein the main surface of the light-emitting layer is inclined at an angle of 0.3° to 1° with respect to the c-plane.

3. The method for driving the light-emitting diode according to claim 1, wherein the luminance of the light-emitting diode is modulated with current density within a range of 10 A/cm$^2$ or less.

4. The method for driving the light-emitting diode according to claim 1, wherein pulse driving is used in combination.

5. The method for driving the light-emitting diode according to claim 1, wherein the light-emitting diode has an emission wavelength of 500 to 550 nm.

6. A light-emitting diode comprising:
    a p-type layer;
    an n-type layer; and
    a light-emitting layer disposed therebetween and having an indium-containing quantum well structure;
    wherein each of the p-type layer, the n-type layer, and the light-emitting layer includes a nitride-based group III-V compound semiconductor crystal having a wurtzite structure; and
    wherein the light-emitting layer has a main surface inclined at an angle of 0.3° to 1° with respect to a c-plane.

7. A method for driving a display including at least one light-emitting diode including a p-type layer, an n-type layer, and a light-emitting layer disposed therebetween and having an indium-containing quantum well structure, each of the p-type layer, the n-type layer, and the light-emitting layer including a nitride-based group III-V compound semiconductor crystal having a wurtzite structure, the light-emitting layer having a main surface inclined at an angle of 0.25° to 2° with respect to a c-plane, the method comprising:
    modulating a luminance of the light-emitting diode with current density having a magnitude within a range of 20 A/cm$^2$ or less.

8. The method for driving the display according to claim 7, wherein the luminance of the light-emitting diode is modulated by forming part of luminance signals with current density within the range of 20 A/cm$^2$ or less.

9. The method for driving the display according to claim 7, wherein the display is a light-emitting diode display including a matrix of pixels, each including the light-emitting diode.

10. The method for driving the display according to claim 7, wherein the display is a transmissive or semitransmissive liquid crystal display including a backlight and a liquid crystal panel, the backlight including the at least one light-emitting diode.

11. The method for driving the display according to claim 7, wherein the display is a projection display including a light source and a light valve, the light source including the at least one light-emitting diode.

12. The method for driving the display according to claim 11, wherein the light valve is a liquid crystal panel or a digital micromirror device.

13. A display comprising at least one light-emitting diode including:
    a p-type layer;
    an n-type layer; and
    a light-emitting layer disposed therebetween and having an indium-containing quantum well structure;
    wherein each of the p-type layer, the n-type layer, and the light-emitting layer includes a nitride-based group III-V compound semiconductor crystal having a wurtzite structure; and
    wherein the light-emitting layer has a main surface inclined at an angle of 0.3° to 1° with respect to a c-plane.

14. A method for driving an electronic device including at least one light-emitting diode including a p-type layer, an n-type layer, and a light-emitting layer disposed therebetween and having an indium-containing quantum well structure, each of the p-type layer, the n-type layer, and the light-emitting layer including a nitride-based group compound semiconductor crystal having a wurtzite structure, the light-emitting layer having a main surface inclined at an angle of 0.25° to 2° with respect to a c-plane, the method comprising:
    modulating a luminance of the light-emitting diode with current density having a magnitude within a range of 20 A/cm$^2$ or less.

15. An electronic device comprising at least one light-emitting diode including:
    a p-type layer;
    an n-type layer; and
    a light-emitting layer disposed therebetween and having an indium-containing quantum well structure;
    wherein each of the p-type layer, the n-type layer, and the light-emitting layer includes a nitride-based group III-V compound semiconductor crystal having a wurtzite structure; and
    wherein the light-emitting layer has a main surface inclined at an angle of 0.3° to 1° with respect to a c-plane.

16. A method for driving an optical communication apparatus including at least one light-emitting diode including a p-type layer, an n-type layer, and a light-emitting layer disposed therebetween and having an indium-containing quantum well structure, each of the p-type layer, the n-type layer, and the light-emitting layer including a nitride-based group III-V compound semiconductor crystal having a wurtzite structure, the light-emitting layer having a main surface inclined at an angle of 0.25° to 2° with respect to a c-plane, the method comprising:

modulating a luminance of the light-emitting diode with current density having a magnitude within a range of 20 A/cm$^2$ or less.

17. An optical communication apparatus comprising at least one light-emitting diode including:

a p-type layer;

an n-type layer; and a light-emitting layer disposed therebetween and having an indium-containing quantum well structure;

wherein each of the p-type layer, the n-type layer, and the light-emitting layer includes a nitride-based group III-V compound semiconductor crystal having a wurtzite structure; and wherein the light-emitting layer has a main surface inclined at an angle of 0.3° to 1° with respect to a c-plane.

* * * * *